(12) United States Patent
Leuschner et al.

(10) Patent No.: US 7,170,173 B2
(45) Date of Patent: Jan. 30, 2007

(54) MAGNETICALLY LINED CONDUCTORS

(75) Inventors: Rainer Leuschner, Mohegan Lake, NY (US); John Slonczewski, Katonah, NY (US)

(73) Assignees: Infineon Technologies Aktiengesellschaft, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,528

(22) Filed: Apr. 17, 2003

(65) Prior Publication Data

US 2004/0207086 A1 Oct. 21, 2004

(51) Int. Cl.
*H01L 23/48* (2006.01)
*H01L 23/52* (2006.01)
*H01L 29/40* (2006.01)

(52) U.S. Cl. ............... 257/758; 257/425; 365/171
(58) Field of Classification Search ........... 257/425, 257/758; 365/171
See application file for complete search history.

(56) References Cited

U.S. PATENT DOCUMENTS 5,956,267 A * 9/1999 Hurst et al. ............ 365/158
6,707,083 B1 * 3/2004 Hiner et al. ............ 257/295
7,005,691 B2 * 2/2006 Odagawa et al. .......... 257/295
2003/0137053 A1 * 7/2003 Okayama ................ 257/758
2004/0032010 A1 * 2/2004 Kools et al. ............. 257/659

OTHER PUBLICATIONS

Durlam, M., et al., "A low power 1Mbit MRAM based on 1T1MTJ bit cell integrate with Copper Interconnects", Jun. 13-5, 2002, VLSI Circuits Dig. of Tech papers, pp. 158-161.*
Lenssen, K.-M.H., et al., "Magnetic Random Access Memory (MRAM) and its prospects," 6 pages.
Reohr, W., et al., "Memories of Tomorrow," IEEE Circuits & Devices Magazine, Sep. 2002, pp. 17-27.

* cited by examiner

*Primary Examiner*—Howard Weiss
(74) *Attorney, Agent, or Firm*—Slater & Matsil, L.L.P.

(57) ABSTRACT

A conductor with improved magnetic field per current ratio is disclosed. The conductor includes a magnetic liner lining a second surface and sides thereof. The corners of the conductor where the second surface and the sides meet are rounded. The rounded corners have been found to improve the concentration of magnetic flux in the magnetic liner.

28 Claims, 10 Drawing Sheets

FIG 1

PRIOR ART

MAGNETICALLY LINED CONDUCTORS

BACKGROUND OF INVENTION

Ferromagnetic elements are used, for example, to form non-volatile memory cells. A magnetic element typically includes bottom and top magnetic layers separated by a non-magnetic layer. The non-magnetic layer, for example, comprises an insulating material to form a magnetic tunnel junction (MTJ) type element. First and second conductors are magnetically coupled to the top and bottom magnetic layers to from a magnetic memory cell. One conductor is referred to as the bitline and the other is referred to as the wordline. The bitline and wordline are orthogonal to each other. A plurality of magnetic elements are interconnected by wordlines and bitlines to form an array.

The magnetic layers of an element are formed with magnetic vectors along an easy axis. The magnetic vector of one layer is fixed in a first direction along the easy axis (e.g., reference or fixed layer) and the magnetic vector of the other layer can be switched between first and second opposite directions along the easy axis (e.g., storage layer). As such, the magnetic vectors in the layers can be oriented parallel or antiparallel to each other. The top magnetic layer with switchable magnetic vector is referred to as the storage or free layer.

The direction of the vector in the storage layer can be switched by the application of a magnetic field generated by passing a current through one or both conductors. Depending on the magnetic field generated, the magnetic vector in the second layer either switches direction or remains the same. The magnetic element would have a first or second resistance value based on whether the magnetic vectors are oriented parallel or anti-parallel, representing a first or a second logic state being stored. For example, the magnetic element will have a high resistance value when the vectors of the layer are antiparallel to represent a logic 1 or a low resistance when the vectors are parallel to represent a logic 0. The states stored in the element can be read by passing a sense current through the element and sensing the difference between the resistances.

The magnitude of the magnetic field used to switch the magnetic vector is proportional to the magnitude of the current through the conductor. To reduce power consumption, it is desirable to increase the field per current ratio of the conductor. One conventional technique of increasing the field per current ratio is to provide a magnetic liner for conductors. Magnetic liners for conductors are described in, for example, Naji et al., "A low power 1Mbit MRAM based on 1T1MTJ bit cell integrated with Copper Interconnects, VLSI Conf. (2002)", which is herein incorporated by reference for all purposes.

Figure 1:
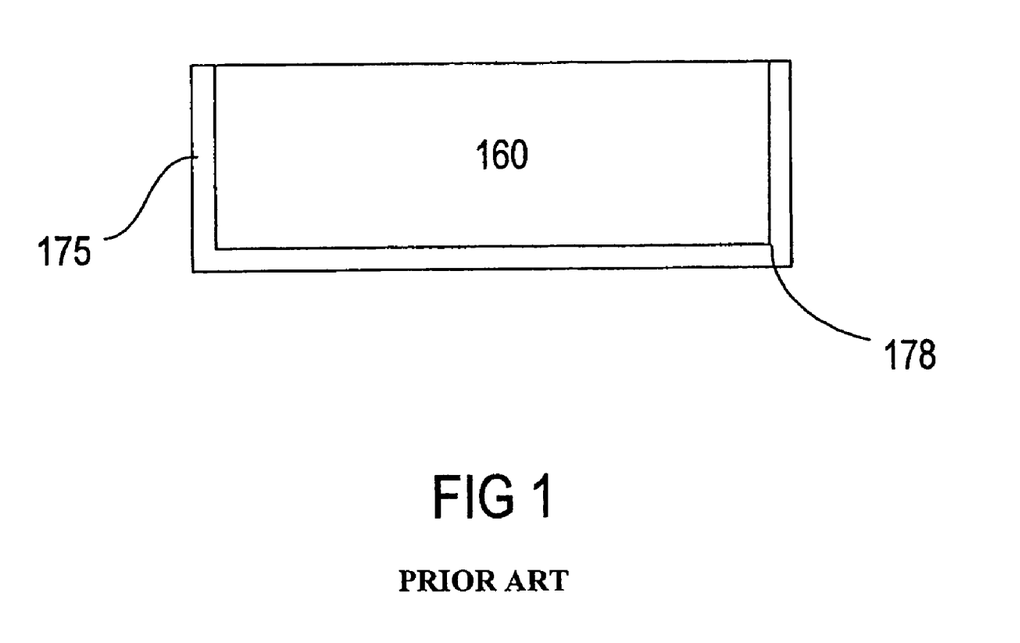
FIG. 1 shows a conventional conductor with a magnetic liner.

FIG. 1 shows a cross-sectional view of a conductor 160 with a magnetic liner 175. As shown, the cross-section of the conductor comprises a rectangular shape. The magnetic liner lines the sides and bottom surface of the conductor. However, it has been found that the sharp corners 178 at the sides and bottom of the conductor prevent the magnetic field from being concentrated in the liner. This results in the magnetic field being spread out in the corners, thus reducing the effectiveness of the liner. For example, such magnetic liners have been measured to improve the gain of the magnetic field for a given current by only about 2.

From the above discussion, there is desire to provide a magnetic liner for a conductor which can more effectively and efficiently concentrate the magnetic field therein.

SUMMARY OF INVENTION

The invention relates to improving the magnetic field per current ratio of a conductor of an integrated circuit. In one embodiment, the conductor includes first and second surfaces and sides. The corners of the conductor where the second surface and the sides meet are rounded. A magnetic liner lines the second surface and sides. It has been found that, by providing a magnetically lined conductor with rounded corners the magnetic field per current ratio can be increased over conventional magnetically lined conductors with non-rounded corners.

In one embodiment, such conductors can serve as either wordlines, bitlines or both of an array of magnetic memory cells. A memory cell includes, for example, a magnetic memory element having first and second conductors in magnetic communication thereto. At least one of the conductors includes rounded corners having the first surface adjacent to the magnetic element. The second surface and sides are lined with a magnetic liner. The magnetically lined conductor, for example, can be located above or below the memory cell. Preferably, magnetically lined conductors with rounded corners are located both above and below the magnetic memory element.

DETAILED DESCRIPTION

Figure 2:
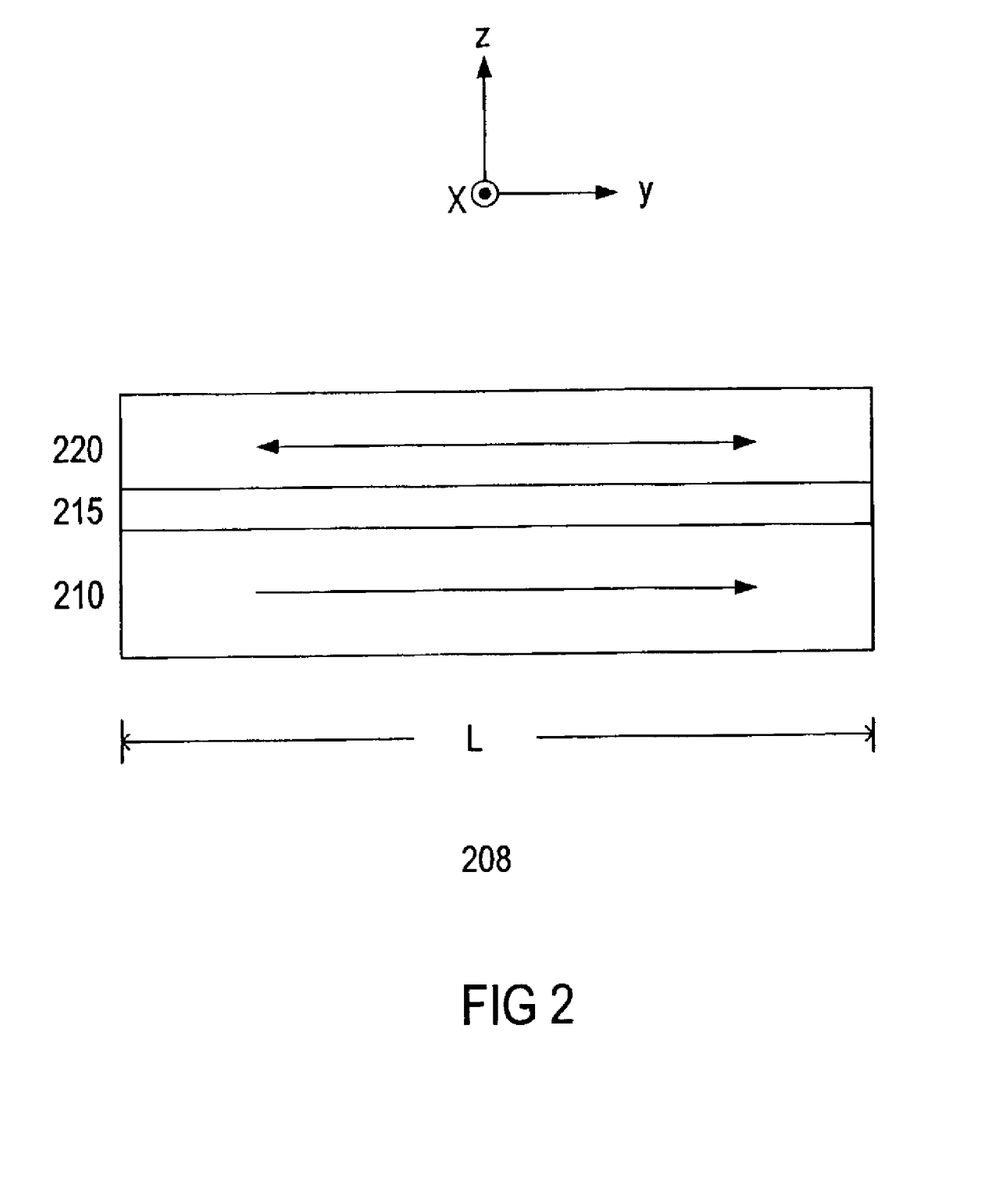
FIG. 2 shows magnetic element.

FIG. 2 shows a magnetic element 208 in accordance with one embodiment of the invention. For purposes of discussion, the z-axis is in the vertical direction with the positive z-direction toward the top, y-axis is in the horizontal direction with the positive y-direction toward the right, and the x-axis perpendicular to both the z and y-axes with the positive x direction coming out of the drawing.

The magnetic element comprises first and second magnetic layers 210 and 220. The magnetic layers can be formed from ferromagnetic materials, such as nickel, iron, cobalt, alloys or combinations thereof. For example, the magnetic layers can be formed of nickel-iron, nickel-iron-cobalt, or cobalt iron. Other types of ferromagnetic materials can also be useful. It is understood that the first and second layers need not be formed of the same materials. For example, one of the layers comprises nickel-iron (NiFe) and the other comprises cobalt-iron (CoFe).

In one embodiment, the storage layer comprises NiFe and the reference layer comprises multiple layers. In one embodiment, the reference layer comprises first and second magnetic layers separated by a conductive layer. The reference layer comprises, for example, a first magnetic layer of either CoFe or NiFe and a second magnetic layer of CoFe separated by a ruthenium (Ru) layer. Other combinations of magnetic and conductive materials are also useful. Providing one or both magnetic layers formed from a composite ferromagnetic material having more than one magnetic layer is also useful. The composite layer can also be formed with a combination of ferromagnetic and non-ferromagnetic conductive materials.

In another embodiment, the reference layer further comprises an antiferromagnetic layer. The antiferromagnetic layer comprises, for example, platinum manganese (PtMn). Other antiferromagnetic materials are also useful. The antiferromagnetic layer increases the pinning effect on the reference layer. The magnetization of the antiferromagnetic layer can be aligned by subjecting it to an external magnetic field at elevated temperatures.

In one embodiment, the reference layer comprises first magnetic layer, conductive layer, second magnetic layer, and antiferromagnetic layer. In one embodiment, the first magnetic layer comprises either CoFe or NiFe, the conductive layer comprises Ru, the second magnetic layer comprises CoFe, and the antiferromagnetic layer comprises PtMn. Other combinations of magnetic, conductive, and antiferromagnetic materials are also useful. The thickness of the various layers are selected to achieve characteristics. For example, the thickness of the first magnetic layer is about 2 nm, the conductive layer is about 1 nm, the second magnetic layer is about 2 nm, and the antiferromagnetic or pinning layer is about 20 nm. Other thicknesses are also useful.

The first and second magnetic layers are separated by a non-magnetic layer 215. In one embodiment, non-magnetic layer comprises an insulating material, such as aluminum oxide. Other types of insulating materials, including aluminum nitride, tantalum oxide or magnesium oxide, are also useful. Separating the magnetic layers with an insulating layer creates a magnetic tunnel junction (MTJ) type element. Forming other types of magnetic elements are also useful. For example, the magnetic layers can be separated by a conductive layer, such as ruthenium (Ru), copper (Cu) or chromium (Cr), to create a giant magnetoresistive (GMR) type magnetic element.

The magnetic element generally is rectangular or elliptical in shape having a length L and a width. Furthermore, other cell shapes, such as rectangular or oval, are also useful. In one embodiment, the magnetic element is formed with an easy axis of magnetization along its length L and a hard axis parallel to its width. The length, for example, is about 70 400 nm. Typically, the length to width ratio of the magnetic element is about 2–4. Other dimensions or length to width ratios are also useful. Providing a cell shape having length larger than the width is preferable since such configuration aligns the magnetization of the layers along the direction of the length (parallel or anti-parallel) by shape anisotropy.

As illustrated, the length is parallel to the y-axis and width is parallel to the x-axis. The magnetic element comprises first and second ends 207 and 208 along the length of the element. The magnetic vectors in the layers are aligned parallel to the easy axis (e.g., parallel to length of element). Aligning the magnetic vectors of the layers in other directions is also useful. Aligning the magnetic vectors of the layers along a preferred direction (e.g., length) can also be achieved by other techniques, such as intrinsic anisotropy. This is particularly useful for other cell shapes or aligning the magnetic vectors in directions other than along the length.

In one embodiment, one of the magnetic layers comprises a magnetic vector which is fixed or pinned in a first direction parallel to the easy axis (e.g., length of element), creating the reference layer. The first direction, for example, is in the positive y-direction, as depicted by the arrow 211. Providing a fixed magnetic vector in the negative x-direction (e.g., to the left) is also useful. The other layer comprises a magnetic vector which can be switched between first and second opposite directions along the easy axis, forming the storage layer. In a preferred embodiment, the reference layer is located above the non-magnetic layer. Locating the reference layer below the non-magnetic layer is also useful. Other types of memory elements can also be used.

The magnetic element has a first or second resistance value, depending on whether the magnetic vectors of the magnetic layers are parallel or antiparallel. The first and second resistance values correspond to first and second states (e.g., logic 0 and logic 1).

The magnetic vector in the storage layer can be switched between the first and second directions by the application of a magnetic field. The magnetic field can be provided by, for example, flowing a current through a conductor in magnetic communication with the magnetic element. The current induces a magnetic field. The direction and strength of the magnetic field depend on the direction and magnitude of the current. Preferably, the magnetic field is provided by flowing current through first and second conductors in magnetic communication with the magnetic element. One conductor is located below and the other above the magnetic element. The first and second conductors, for example, are orthogonal, serving as bitlines and wordlines of a memory array. Providing bitlines and wordlines arranged in other configurations are also useful.

Figure 3:
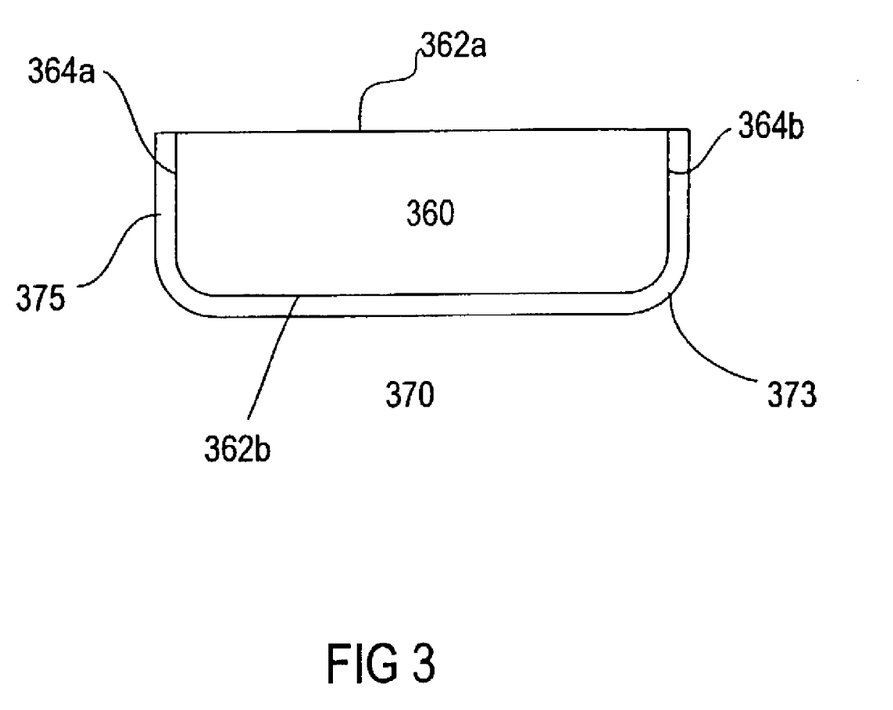
FIGS. 3–4 show conductors in accordance with various embodiments of the invention.

FIG. 3 shows a cross-sectional view of a conductor 370 in accordance with one embodiment of the invention. The conductor increases the magnetic field per current ratio. As shown, the conductor includes a conductive line 360. In one embodiment, the conductive line is formed of copper or copper alloy. Aluminum or other conductive materials, including alloys or a combination thereof, can also be useful. The conductive line comprises first and second surfaces 362*a–b* and sides 364*a–b*.

The dimensions of the conductor are selected to provide the desired electrical characteristics (e.g., resistance and current load). Generally, the dimensions of the conductor are selected to have low sheet resistance while sufficient to accommodate the current load. Preferably, the dimensions of the conductor takes into account the desired electrical characteristics as well as space considerations. In one embodiment, the width of the conductor is equal to either the width or length of the magnetic element, depending on which direction the conductor is magnetically or electrically coupled to the magnetic element. The height, for example, is about 300 nm. Other dimensions are also useful, depending on design requirements.

As an example, for a magnetic element having a dimensions equal to about 200×400 nm, the conductor which is magnetically or electrically coupled to the magnetic element along the direction of the length of the magnetic element (e.g., easy axis), it comprises a width equal to about the 200 nm (e.g., width of the magnetic element) while the conductor which is magnetically or electrically coupled to the magnetic element along the direction of the width of the element (e.g., hard axis), it comprises a width equal to about 400 nm (e.g., the length of the magnetic element). Generally, the width of the conductor is slightly wider than either the width or length of the magnetic element to accommodate for overlay error. In one embodiment, the wordline is equal to about or slightly wider than the width of the magnetic element while the bitline is equal to about or slightly wider than the length of the magnetic element or vice versa.

A liner 375 lines the sides and one of the top or bottom surface of the conductor. The liner serves to concentrate the magnetic field to the surface of the conductor that is not covered with the liner. The use of such types of liners is described in, for example, M. Durlam, P. Naji et al., A low power 1 Mbit MRAM based on ITIMTJ bit cell integrated with Copper Interconnects, VLSI Conference (2002), which is herein incorporated by reference for all purposes. In one embodiment, the liner comprises a ferromagnetic material. Preferably, the magnetic material should have a high permeability. Various magnetic materials, such as NiFe, CoFe, or CoW, are useful to form the liner. Other magnetic materials are also useful. The unlined surface is adjacent to a magnetic element. The thickness of the liner should be sufficient to prevent saturation of the liner in the field that is needed to switch the magnetic element. Typically, the thickness of the magnetic liner is about 5 to 50 nm. Other thicknesses are also useful.

In accordance with one embodiment, the corners 373 formed by the second surface and the sides are rounded. Since the ferromagnetic liner lines the conductive line, it also has rounded corners. It has been found that rounding the corners in the magnetic liner improves the flow of magnetic flux in either in the clockwise or counter clockwise direction in the magnetic liner. The direction of the flux flow depends on the direction of current through the conductor. By improving the flux flow in the magnetic liner, a greater amount of magnetic field can be concentrated in the magnetic liner than with conventional rectangular conductive lines. This improves the magnetic field gain produced by the magnetic liner.

In one embodiment, the corners of the conductive line formed by the second surface and sides are rounded sufficiently to enable the magnetic liner to produce a field gain greater than that possible with conventional magnetically lined conductive lines without rounded corners. Preferably, the corners of the conductive line are rounded to produce a gain greater than about 2. More preferably, the corners are rounded to produce a field gain of at least about 3 to 4. It is understood that roundness of both corners need not be equal. Providing a conductive line where the lined surface forms a semi-circular shape or other shapes which do not have corners is also useful. In a preferred embodiment, the product of the thickness of the magnetic liner and radius of curvature of the rounded corners is at least 200 nm². The radius of curvature is based on the radius of a circle that would fit into the corner of the conductive line.

Figure 4:
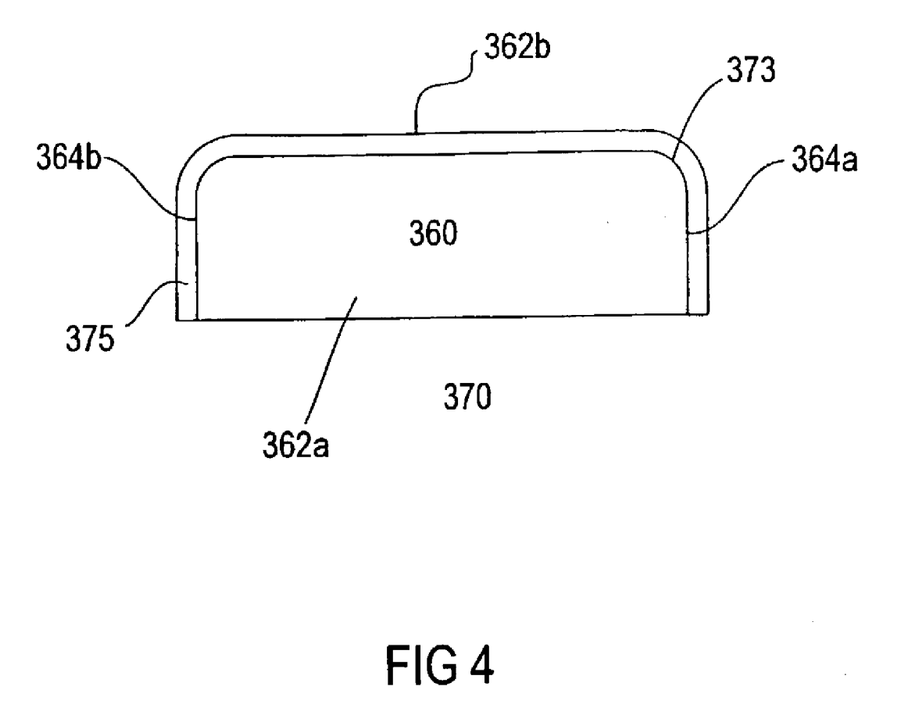

If the magnetic element is switched by a magnetic field generated from a conductor located below the magnetic element, the first or unlined surface is the top surface of the conductive line. Alternatively, the first or unlined surface is the bottom surface if the magnetic field is generated by a conductor located above the magnetic element, as shown in FIG. 4. It is also useful to generate magnetic fields from conductors located above and below the magnetic element.

Figure 5:
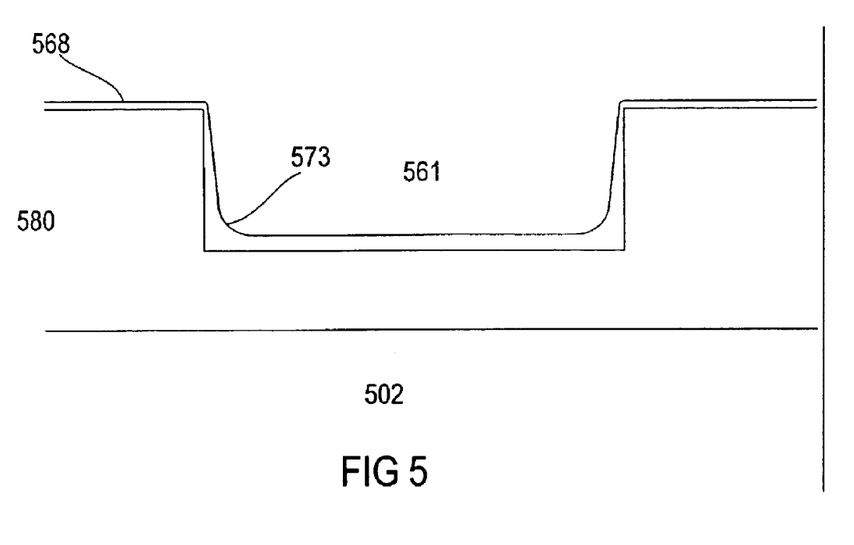
FIGS. 5–8 show a process for forming a conductor in accordance with one embodiment of the invention.

FIGS. 5–8 show a process for forming a conductor in accordance with one embodiment of the invention. Referring to FIG. 5, a substrate is provided. The substrate, for example, is prepared with support circuitry (not shown), for accessing the memory array. Additionally, other components that serve as part of an IC are also included. An interlevel dielectric layer (ILD) 580 is provided over the substrate surface, covering components already formed thereover. The ILD layer comprises, for example, silicon oxide. Other types of dielectric materials, such as doped silicate glass or silicon nitride, can also be used. The dielectric layer is prepared with a trench 561. The trench is formed by, for example, conventional mask and etch techniques. Such techniques include forming a resist mask and anisotropically etching (e.g., reactive ion etching or RIE) the dielectric layer.

In one embodiment, a dielectric layer coats the surfaces of the trench to round the corners. Preferably, the dielectric layer coats the trench surfaces using spin-coating techniques. Spin-coated dielectric material includes, for example, spin-on glass. The spin-on glass comprises, for example, a soluble silicon dioxide precursor, such as hydrogenated silsequioxane. In one embodiment, the hydrogenated silsequioxane is diluted in methyl isobutyl ketone. Other types of dielectric materials, such as polyimide or polybenzoxazol, which can be deposited by spin-coating techniques are also useful. Coating the surfaces of the trench using techniques, such as spray coating, is also useful.

In one embodiment, the thickness of the dielectric layer which rounds the corners fills less than or equal to 10% of the trench. Other thicknesses are also useful. Preferably, the trench depth takes into account of the reduced height caused by the spin-coated dielectric material. The spin-on dielectric layer rounds the corners of the trench. In one embodiment, the deposition parameters can be selected to cause the dielectric material to collect at the sides of the trench, creating rounded corners 573. The parameters, for example, take into account spin speed, viscosity of the dielectric material, trench aspect ratio as well as the surface energy of the trench.

The corners, in one embodiment, are rounded sufficiently to produce a field gain of greater than about 2 with the use of a magnetic liner. Preferably, the field gain is at least about 3–4. In another preferred embodiment, the product of the radius of the rounded corners and thickness of the liner layer exceeds 200 nm². Providing a trench having a semi-circular shape, or other shapes with rounded corners, or other shapes which do not have corners are also useful.

An adhesion promoting layer can be deposited on the substrate prior to spin-coating the dielectric material. In one embodiment, the adhesion promoting layer comprises hexamethyldisilazane. Other types of adhesion materials are also useful. The adhesion promoting layer preferably adjusts the surface energy of the trench to that of the ILD layer. More preferably, the adhesion layer comprises a monolayer. By adjusting the surface energy in the correct range, the precursor of the dielectric material can be induced to spread in the trench to create the desired shape.

The dielectric precursor solution is cured to stabilize the spin-coated dielectric layer. The solution is cured, in one embodiment, by heating the substrate at about 350–400° C. for about 1 hour. The use of microwave or inductively coupled radio frequency oxygen plasma enables the curing to be performed at reduced temperatures and reduced curing time. Alternative techniques for curing the precursor solution are also useful.

In an alternative embodiment, the ILD layer can be etched to form a trench with rounded corners at the bottom. This can be achieved by selecting the etch parameters to produce a substantially vertical sidewall profile at the first part of the etch process. For example, chamber geometry (e.g., anode area>cathode area), pressure (low) and power (high to create approximately self bias) are appropriately selected. In the second part of the etch process, the parameters are altered to produce a non-vertical sidewall profile to increase the radius of curvature in at least the bottom corners of the trench. For example, the non-vertical sidewall profile can be achieved by increasing pressure, reducing power, altering the gas composition to produce a higher carbon content, or a combination thereof.

In one embodiment, the etch process is performed in, for example, an inductively coupled plasma etcher. The etch parameters in the first part of the etch process are selected to form a vertical or substantially vertical sidewall profile. The parameters of the first part of the etch process comprise, for example, as follow: plasma power at about 1000 W; bias power at about 1000 W; pressure at about 8 mtorr; and gas flow of Ar/C$_4$F$_8$ normal.

Other etch parameters which produces a substantially vertical profile is also useful. In one embodiment, the etch parameters of the second part of the etch process are as follows: plasma power at about 1000 W; bias power at about 100 W; pressure at about 8 mtorr; and gas flow of Ar/C$_4$F$_8$ having reduced Ar and increased C$_4$F$_8$ content.

Other etch parameters which produce a non-vertical profile is also useful. The parameters can be gradually changed to produce the desired profile.

The second part of the etch process, in one embodiment, commences after about ⅔ of the trench has been formed. Starting the second part of the etch process prior or after ⅔ of the trench has been formed is also useful. Alternatively, the etch process which produces a non-vertical profile can commence at the beginning of trench formation to produce, for example, a semi-circular shaped trench. Selecting the etch parameters to produce other shaped trenches which do not have corners is also useful.

The trench can be selectively patterned to form vias which, for example, provide access to the underlying metal layer or conductive region as desired. The trench can be patterned before or after the trench corners have been rounded, where a spin-coated dielectric layer is used to round the trench.

Figure 6:
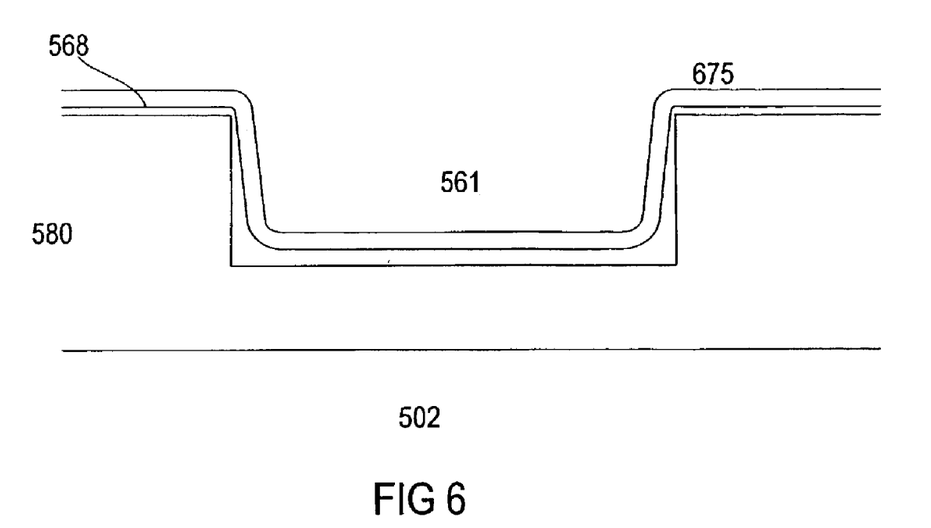

Referring to FIG. 6, a magnetic liner is deposited, covering the substrate and lining the trench. The magnetic liner comprises, for example, cobalt-iron alloy. Other types of ferromagnetic materials, such as nickel-iron or cobalt-nickel-iron, are also useful. The magnetic liner is deposited by, in one embodiment, electroless plating, electroplating or sputtering. Other deposition techniques, such as physical vapor deposition (PVD) or ion beam deposition (IBD), are also useful. Typically, the thickness of the magnetic liner is about 5–50 nm.

If necessary, a barrier layer can be deposited prior to forming the magnetic liner. The barrier serves to prevent the diffusion of liner material into the ILD material. In one embodiment, the barrier comprises tantalum nitride, tungsten nitride or titanium nitride. Other types of barrier materials are also useful. The thickness of the barrier, for example, is about 10 nm. Other thicknesses are also useful. Various deposition techniques, such as PVD or IBD, can be used to form the barrier layer.

Figure 7:
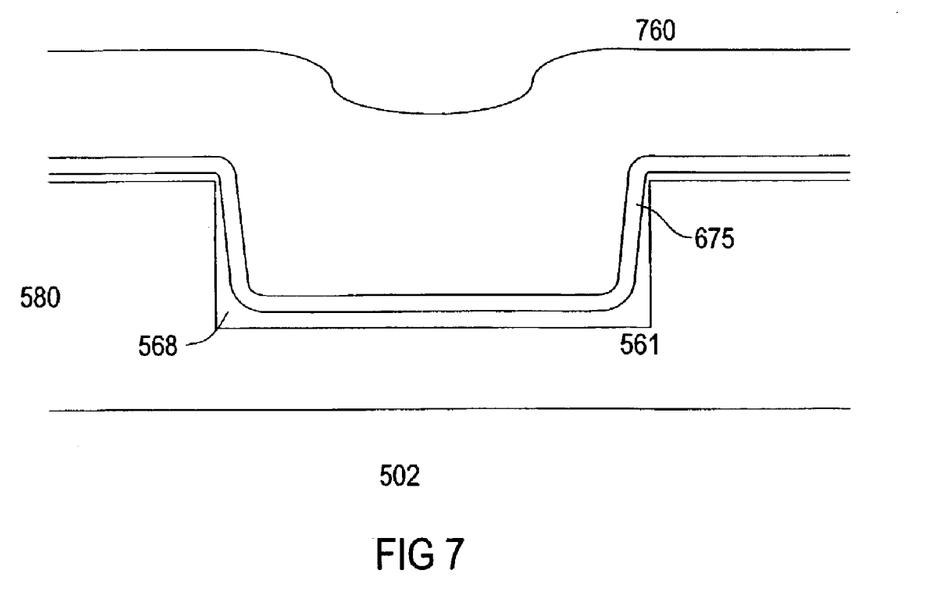
Figure 8:
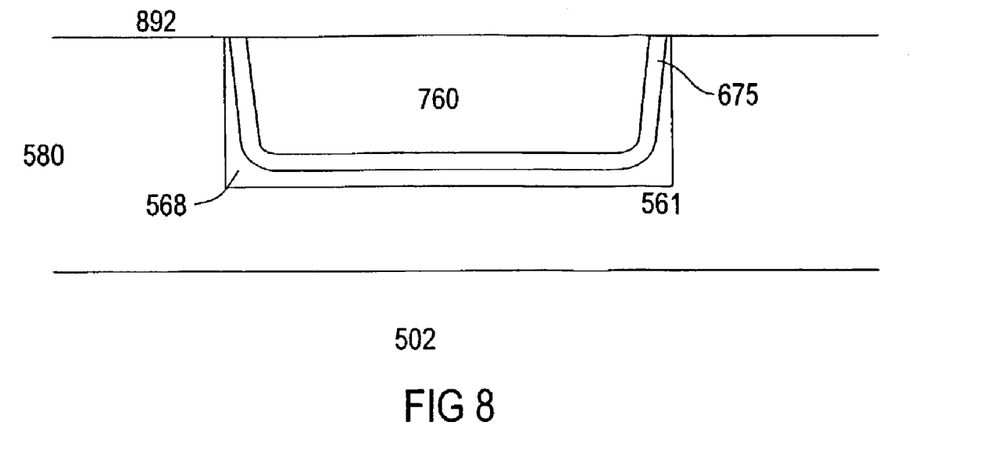

Referring to FIG. 7, a conductive material is deposited on the substrate, filling the trench. The conductive material, in one embodiment, comprises copper or copper alloy. Other conductive materials can also be useful. In one embodiment, the conductive material is deposited by electroplating. A barrier layer can be deposited prior to forming conductive material, preventing diffusion of the conductor material into the liner or vice-versa. This is particularly useful where copper is used. The barrier layer, for example, comprises tantalum nitride, tungsten nitride or titanium nitride. Other types barrier materials can also be used. Excess material above the substrate is removed by CMP to create a planar surface 892 between the top of the conductive material and the ILD layer, as shown in FIG. 8. Thereafter, the process continues to form a magnetic element, such as one described in FIG. 3, above the conductor.

Figure 9:
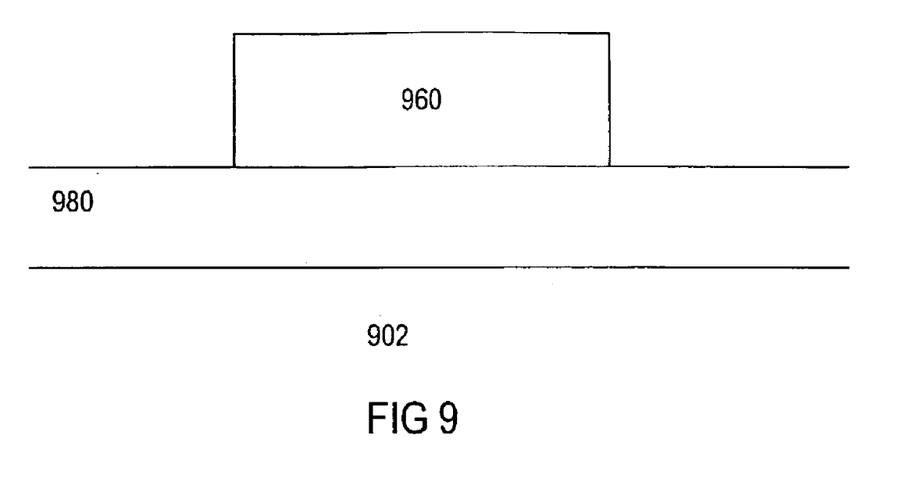
FIGS. 9–10 show a process for forming a conductor in accordance with another embodiment of the invention.
Figure 10:
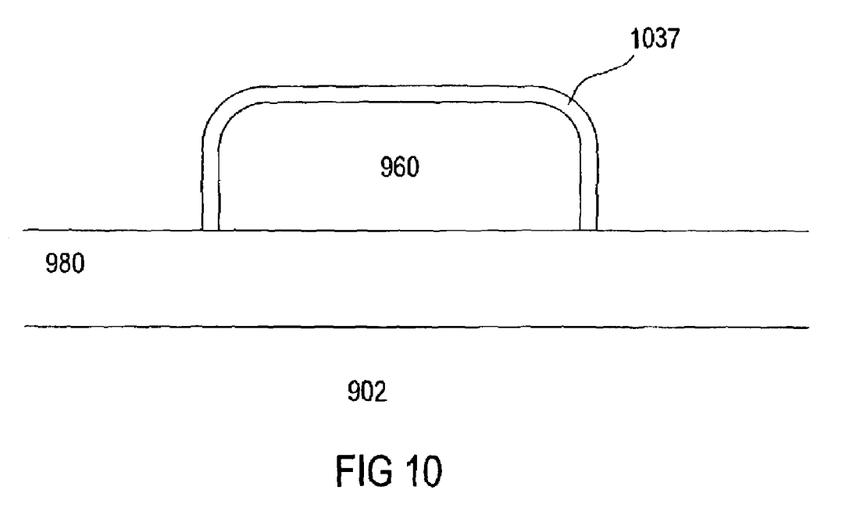

FIGS. 9–10 show a process for forming a conductor in accordance with another embodiment of the invention. Referring to FIG. 9, a substrate is provided. The substrate, for example, is prepared with support circuitry (not shown), magnetic element, and an interlevel dielectric layer (ILD) 980 thereover. The dielectric layer comprises, for example, silicon oxide. Other types of dielectric materials, such as doped silicate glass or silicon nitride, can also be used. Additionally, other components that serve as part of an IC are also included.

Above the ILD layer is formed a conductive line 960. The conductive line is located, in one embodiment, in magnetic coupling to a magnetic element below. The conductive line can be electrically coupled or isolated from the magnetic element. To electrically couple the conductive line to magnetic element, a contact can be used. Alternatively, the conductive element can be in direct electrical contact with the magnetic element. In one embodiment, the conductive line is formed by a damascene process. For example, a trench is formed in a dielectric layer and filled with conductive material. The conductive material is planarized to remove the excess conductive material.

A portion of the dielectric material is then removed, leaving the conductive line as shown. In one embodiment, a dielectric etch stop layer is located below the conductive line. The etch stop layer comprises, for example, silicon nitride. Other materials which can be etched selective to the dielectric material used in the damascene process to form the conductive line is also useful. The dielectric material can then removed selective to the etch stop layer and conductive material, leaving the conductive line above the etch stop layer, as shown. Where a contact is used to couple the conductive line to the magnetic element, dual damascene technique is preferably employed.

In one embodiment, the etch parameter of the etch used to remove the dielectric layer can be selected to produce a conductive line whose upper corners 1037 are rounded, as desired. Alternatively, a separate etch process can be used to produce the desired cross sectional shape of the conductive line.

A magnetic liner is then deposited to line the exposed portion of the conductive line. Typically, the magnetic liner is about 5–50 nm. Various techniques can be used to deposit the magnetic liner. If the magnetic liner is blanket deposited over the substrate, such as by electroplating with a sputtered seed layer, sputtering, PVD or IBD, then the excess portions of the liner above the etch stop layer or ILD layer are removed to prevent shorting with other lines. Removal of the excess portion is achieved using, for example, conventional mask and etch techniques. Alternatively, electroless plating, electroplating (using interconnected lines), or other selective deposition techniques can also be used to form the conductor. The process continues, completing the fabrication of the IC.

Although the invention has been described in the context of forming a single conductive line, it is understood that a plurality of conductive lines are present in an IC. The conductive lines serve, for example, bitlines and/or word-lines interconnecting a plurality of memory cells to form an array. The memory cells can be arranged in a cross-point architecture. Other types of architectures, such as FET architecture or diode architecture are also useful. Various magnetic memory architectures are described in, for example, Reohr et al., IEEE Circuits and Devices Magazine (Sep. 17, 2002); and Persoon et al., "Magnetic Random Access Memory and its prospects", JPL Publ. 01–15, pp 177 (November 2001), which are herein incorporated by reference for all purposes.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

We claim:

1. An integrated circuit comprising:
an unshielded conductor for generating a magnetic field, the conductor having first and second surfaces and sides;
rounded corners where the second surface and sides meet;
a ferromagnetic liner lining at least the sides and second surface of the unshielded conductor, said ferromagnetic liner having rounded corners between said sides and said second surface, and a thickness of between about 5 nm and 50 nm and such that the product of the radius of the rounded corners and thickness of said liner is at least 200 nm$^2$, the ferromagnetic liner comprising nickel, iron, cobalt, alloy thereof, or a combination thereof,
a first diffusion barrier between an outer surface of the liner and a dielectric layer in which the unshielded conductor is disposed; and
a second diffusion barrier disposed between an inner surface of the liner and the conductor.

2. The integrated circuit of claim 1 wherein:
the unshielded conductor comprises copper, aluminum, argentum, gold, alloys thereof, or a combination thereof.

3. The integrated circuit of claim 1 wherein the first surface is adjacent to a magnetic element.

4. The integrated circuit of claim 3 wherein the first surface is either a top or bottom surface of the conductor.

5. The integrated circuit of claim 4 wherein:
the unshielded conductor comprises copper, aluminum, argentum, gold, alloys thereof, or a combination thereof.

6. The integrated circuit of claim 1 wherein the rounded corners improves the field gain of the magnetic conductor.

7. The integrated circuit of claim 6 wherein the rounded corners improves the field gain by greater than 2.

8. The integrated circuit of claim 6 wherein the rounded corners improves the field gain by at least 3–4.

9. An integrated circuit including an array of magnetic cells, wherein a memory cell comprises:
a magnetic element;
a first unshielded conductor located above the magnetic element and in magnetic communication thereto, the first conductor having first and second surfaces and sides, the first surface of the first conductor is adjacent to the magnetic element;
a second unshielded conductor located below the magnetic element in magnetic communication therewith, the second conductor having first and second surfaces and sides, the first surface of the second conductor is adjacent to the magnetic element;
wherein at least one of the first and second unshielded conductors have rounded corners where the second surface meets the sides;
a ferromagnetic liner lining the second surface and sides of the at least one conductor with rounded corners, said ferromagnetic liner also having rounded corners and a thickness of between about 5 nm and 50 nm and such that the product of the radius of the rounded corner and thickness of said liner is at least 200 nm$^2$, and said ferromagnetic liner with rounded corners concentrating the magnetic field in said liner and at said first surface of said conductor with rounded corners, and said ferromagnetic liner comprising nickel, iron, cobalt, alloy thereof, or a combination thereof;
a first diffusion barrier between an outer surface of the liner and a dielectric layer in which the conductor is disposed; and
a second diffusion barrier disposed between an inner surface of the liner and the at least one conductor with rounded corners.

10. An integrated circuit comprising:
an unshielded conductor for generating a magnetic field, the conductor having first and second surfaces and sides and said conductor having rounded corners where said sides and said second surface meet;
a layer of ferromagnetic material in contact with and conforming to said sides and said second surface, said ferromagnetic material also having rounded corners and a thickness of between about 5 nm and 50 nm such that the product of the radius of the rounded corners and thickness of the ferromagnetic material is at least 200 nm$^2$, and said rounded corner of said ferromagnetic material concentrating the magnetic field in said layer and at said first surface, the ferromagnetic material comprising nickel, iron, cobalt, alloy thereof, or a combination thereof, and such that the rounded corners improves the field gain by greater than 2;
a first diffusion barrier located between an outer surface of the layer of ferromagnetic material and a dielectric layer in which the conductor is disposed;
a second diffusion barrier disposed between an inner surface of the layer of ferromagnetic material and the conductor; and
a magnetic element located proximate said first surface of said conductor and responsive to said concentrated magnetic field at said first surface.

11. The integrated circuit of claim 10 further comprising a substrate defining a trench having a bottom surface and sidewalls and wherein said layer of magnetic material covers said bottom surface and sidewalls of said trench and said conductor fills said trench lined with said layer of ferromagnetic material such that the top surface of said conductor filling said trench defines said first surface and wherein said magnetic element is formed over said first surface.

12. The integrated circuit of claim 11 wherein the sidewalls and said bottom surface of said trench define rounded corners.

13. The integrated circuit of claim 11 wherein said rounded corners of said layer of magnetic material comprises excess magnetic material where said sidewalls and said bottom of said trench meet.

14. The integrated circuit of claim 10 further comprising a substrate having said magnetic element formed therein, wherein said bottom surface of said conductor defines said first surface, and wherein said conductor is formed over said integrated circuit.

15. The integrated circuit of claim 11 wherein said unshielded conductor comprises copper, aluminum, argentum, gold, alloys thereof, or a combination thereof.

16. An interacted circuit comprising:
a substrate defining a trench having a bottom and sidewalls;
a layer of ferromagnetic material covering said bottom and sidewalls of said trench to form a magnetic liner having rounded corners, said ferromagnetic material having a thickness of between about 5 nm and 50 nm such that the product of the radius of the rounded corners and thickness of the ferromagnetic material is at least 200 nm$^2$, and the ferromagnetic material comprising nickel, iron, cobalt, alloy thereof, or a combination thereof;

a conductive material filing said trench lined with ferromagnetic material, said conductive material having rounded corners and defining a top surface to form an unshielded conductor such that a DC or low frequency current flowing through said conductive material creates a magnetic field concentrated in said liner and at said top surface such that the rounded corners improves the field gain by greater than 2;

a first diffusion barrier located between an outer surface of the liner and the sidewalls and bottom of the trench in which the conductive material is disposed;

a second diffusion barrier disposal between an inner surface of the liner and the conductive material; and a magnetic element located proximate said top surface of said conductive material and responsive to said concentrated magnetic field.

17. The integrated circuit of claim 16 wherein the conductive material comprises copper, aluminum, argentum, gold, alloys thereof, or a combination thereof.

18. The integrated circuit of claim 10 wherein the rounded corners improves the field gain by at least 3.

19. The integrated circuit of claim 16 wherein the rounded corners improves the field gain by at least 3.

20. The integrated circuit of claim 10 wherein the rounded corners improves the field gain by at least 4.

21. The integrated circuit of claim 16 wherein the rounded corners improves the field gain by at least 4.

22. The integrated circuit of claim 16 wherein said trench has rounded corners where said bottom and said sidewalls meet.

23. The integrated circuit of claim 16 wherein said rounded corners of said layer of magnetic material comprises excess magnetic material where said sidewalls and said bottom of said trench meet.

24. The integrated circuit of clam 16 wherein said conductive material is unshielded.

25. The integrated circuit of claim 1 wherein said circuit is a non-volatile memory circuit and wherein said unshielded conductor is a bit line or a word line.

26. The integrated circuit of claim 9 wherein said magnetic cells are non-volatile memory cells, said first unshielded conductor is one of a bit line or word line and the second unshielded conductor is the other one of said bit line or word line.

27. The integrated circuit of claim 10 wherein said circuit is a non-volatile memory circuit and wherein said unshielded conductor is a bit line or a word line.

28. The integrated circuit of claim 16 wherein said circuit is a non-volatile memory circuit and wherein said unshielded conductor is a bit line or a word line.

* * * * *